(12) United States Patent
Yang et al.

(10) Patent No.: US 8,228,728 B1
(45) Date of Patent: Jul. 24, 2012

(54) PROGRAMMING METHOD FOR MULTI-LEVEL CELL FLASH FOR MINIMIZING INTER-CELL INTERFERENCE

(75) Inventors: Xueshi Yang, Cupertino, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 142 days.

(21) Appl. No.: 12/881,127

(22) Filed: Sep. 13, 2010

Related U.S. Application Data

(60) Provisional application No. 61/242,317, filed on Sep. 14, 2009, provisional application No. 61/257,771, filed on Nov. 3, 2009, provisional application No. 61/258,146, filed on Nov. 4, 2009.

(51) Int. Cl.
*G11C 16/04* (2006.01)

(52) U.S. Cl. ........ 365/185.03; 365/189.011; 365/189.05; 365/230.05

(58) Field of Classification Search ............. 365/185.03, 365/189.011, 189.05, 230.05
See application file for complete search history.

(56) References Cited

U.S. PATENT DOCUMENTS

| | | | | |
|---|---|---|---|---|
| 6,513,130 B1 * | 1/2003 | Cross | ........................... | 714/6.32 |
| 7,668,023 B2 * | 2/2010 | Seong | ...................... | 365/189.05 |
| 7,864,588 B2 * | 1/2011 | Betser et al. | ............... | 365/185.2 |
| 7,924,628 B2 * | 4/2011 | Danon et al. | ............. | 365/185.28 |
| 7,945,825 B2 * | 5/2011 | Cohen et al. | .................. | 714/721 |
| 7,961,513 B2 * | 6/2011 | Ho et al. | .................. | 365/185.03 |

* cited by examiner

*Primary Examiner* — Pho M Luu

(57) ABSTRACT

Systems, methods and computer program products for minimizing floating gate coupling interference and threshold voltage drift associated with flash memory cells are described. In some implementations, the memory cells can be programmed in a predetermined sequence that allows pages with the most-significant bit (MSB) and central significant bit (CSB) to be programmed first prior to programming pages with the least-significant bit (LSB). This sequence allows neighboring cells (e.g., cells neighboring a target cell) to be programmed first so as to reduce the floating gate coupling interference and threshold voltage drift on the target cell that is to be programmed in the subsequent stage. To accommodate the programming sequence (e.g., at the device level), additional buffer memories can be added.

27 Claims, 7 Drawing Sheets

500

Receive a request to program N-bit data into a plurality of storage elements, the N-bit data including the first bit data and last bit data
502

Identify a first storage element in the plurality of storage elements to be programmed first
504

Identify one or more neighboring storage elements adjacent to the first storage element
506

Program the first bit data into the first storage element
508

Program the last bit data into the first storage element after programming corresponding first data into the one or more neighboring storage elements
510

FIG. 5

PROGRAMMING METHOD FOR MULTI-LEVEL CELL FLASH FOR MINIMIZING INTER-CELL INTERFERENCE

CROSS-REFERENCE TO RELATED APPLICATIONS

This application claims priority to U.S. Provisional Application Ser. No. 61/242,317 titled "PROGRAMMING METHOD FOR MLC FLASH FOR MINIMIZING INTER-CELL INTERFERENCE," filed on Sep. 14, 2009, U.S. Provisional Application Ser. No. 61/257,771 titled "FLASH MEMORY DEVICES WITH PROGRAMMING BUFFERS," filed on Nov. 3, 2009, and U.S. Provisional Application Ser. No. 61/258,146 titled "FLASH MEMORY DEVICES WITH PROGRAMMING BUFFERS," filed on Nov. 4, 2009, the disclosure of each of which is incorporated herein by reference in its entirety.

TECHNICAL FIELD

The subject matter of this application is generally related to flash memory.

BACKGROUND

Flash memories typically employ arrays of analog memory cells for storing data. Each analog memory cell can store an analog value, such as an electrical charge or voltage, that represents the information stored in the corresponding cell. Each analog memory cell can hold a certain amount of electrical charge. The range of possible analog values is typically divided into intervals each corresponding to one or more data bit values (e.g., two bits, three bits or four bits). Generally, data is written to an analog memory cell by writing a nominal analog value that corresponds to the desired bit or bits.

Commonly, two types of flash memory devices are used: single-level cell (SLC) flash memory and multi-level cell (MLC) flash memory. SLC flash memory can store a single bit of information in each memory cell, whereas MLC flash memory can store two or more bits per memory cell. While programming for SLC flash memory is generally simple (e.g., as only one bit is placed in a cell), its storage capacity is generally smaller than MLC flash memory and thus less desirable for applications that demand large storage capacity.

To achieve high data storage in MLC flash memory, conventional manufacturing techniques focus on decreasing the size of each individual MLC memory cell without sacrificing benchmark performance. However, decreasing the size of MLC cells also reduces the distance separating the cells, which can cause the MLC flash memory to be susceptible to floating gate coupling and threshold voltage drift (e.g., as the cells are more compact and placed closer together), resulting in data corruption and/or high bit error rate.

SUMMARY

Systems, methods and computer program products for minimizing floating gate coupling interference and threshold voltage drift associated with flash memory cells are described. In some implementations, the memory cells can be programmed in a predetermined sequence that allows pages with the most-significant bit (MSB) and central significant bit (CSB) to be programmed first prior to programming pages with the least-significant bit (LSB). This sequence allows neighboring cells (e.g., cells neighboring a target cell) to be programmed first so as to reduce the floating gate coupling interference and threshold voltage drift on the target cell that is to be programmed in the subsequent stage. To accommodate the programming sequence (e.g., at the device level), additional buffer memories can be added.

In some implementations, a method can be provided that includes identifying one or more first storage elements in communication with a first word line, each of the one or more first storage elements configured to store a first bit, a second bit, and a third bit; identifying one or more second storage elements in communication with a second word line, each of the one or more second storage elements configured to store a first bit, a second bit and a third bit; programming one or more pages associated with the first bit of the one or more first storage elements and the first bit of the one or more second storage elements; programming one or more pages associated with the second bit of the one or more first storage elements and the second bit of the one or more second storage elements; and programming one or more pages associated with the third bit of the one or more first storage elements and the third bit of the one or more second storage elements after programming the one or more pages associated with the first bits and the second bits of the one or more first storage elements and the second storage elements.

In some implementations, programming the one or more pages associated with the second bit of the one or more first storage elements and the second bit of the one or more second storage elements can include programming the one or more pages associated with the second bit of the one or more first storage elements and the second bit of the one or more second storage elements after programming the one or more pages associated with the first bit of the one or more first storage elements and the first bit of the one or more second storage elements.

In some implementations, identifying one or more first storage elements can include identifying one or more first storage elements configured to store a most significant bit, a central significant bit, and a lease significant bit.

In some implementations, a method can be provided that includes receiving a request to program N-bit data into a plurality of storage elements, the N-bit data including first bit data and last bit data, where N>1; identifying a first storage element in the plurality of storage elements to be programmed first; identifying one or more neighboring storage elements adjacent to the first storage element, the one or more neighboring storage elements in communication with a word line different from that of the first storage element; programming the first bit data into the first storage element; and programming the last bit data into the first storage element after programming first bit data into the one or more neighboring storage elements.

In some implementations, receiving the request to program N-bit data can include receiving a request to program three-bit data including the first bit data, second bit data and the last bit data into the plurality of storage elements, each storage element configured to store data including a most-significant-bit (MSB) page corresponding to the first bit data, a central-significant-bit (CSB) page corresponding to the second bit data, and a least-significant-bit (LSB) page corresponding to the last bit data.

In some implementations, programming the LSB page into the first storage element can be performed after programming the MSB page into the first storage element and corresponding MSB pages of the first bit data into the one or more neighboring storage elements.

In some implementations, a system can be provided that includes a memory cell array including a plurality of storage elements including a first storage element and one or more neighboring storage elements, the first storage element and the one or more neighboring storage elements in communication with a different word line; and a memory controller configured to: program first bit data into the first storage element; program corresponding first bit data into a neighboring storage element after the first bit data has been programmed into the first storage element; and program last bit data into the first storage element after the corresponding first bit data has been programmed into the neighboring storage element.

In some implementations, each storage element can be configured to store data including a most-significant-bit (MSB) page corresponding to the first bit data and a least-significant-bit (LSB) page corresponding to the last bit data.

In some implementations, the memory controller can be configured to program the LSB page into the first storage element after programming the MSB page into the first storage element and the corresponding MSB pages into the one or more neighboring storage elements.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 5 shows an example of another process for programming a three-bit flash memory.

Like reference symbols in the various drawings indicate like elements.

DETAILED DESCRIPTION

Figure 1A:
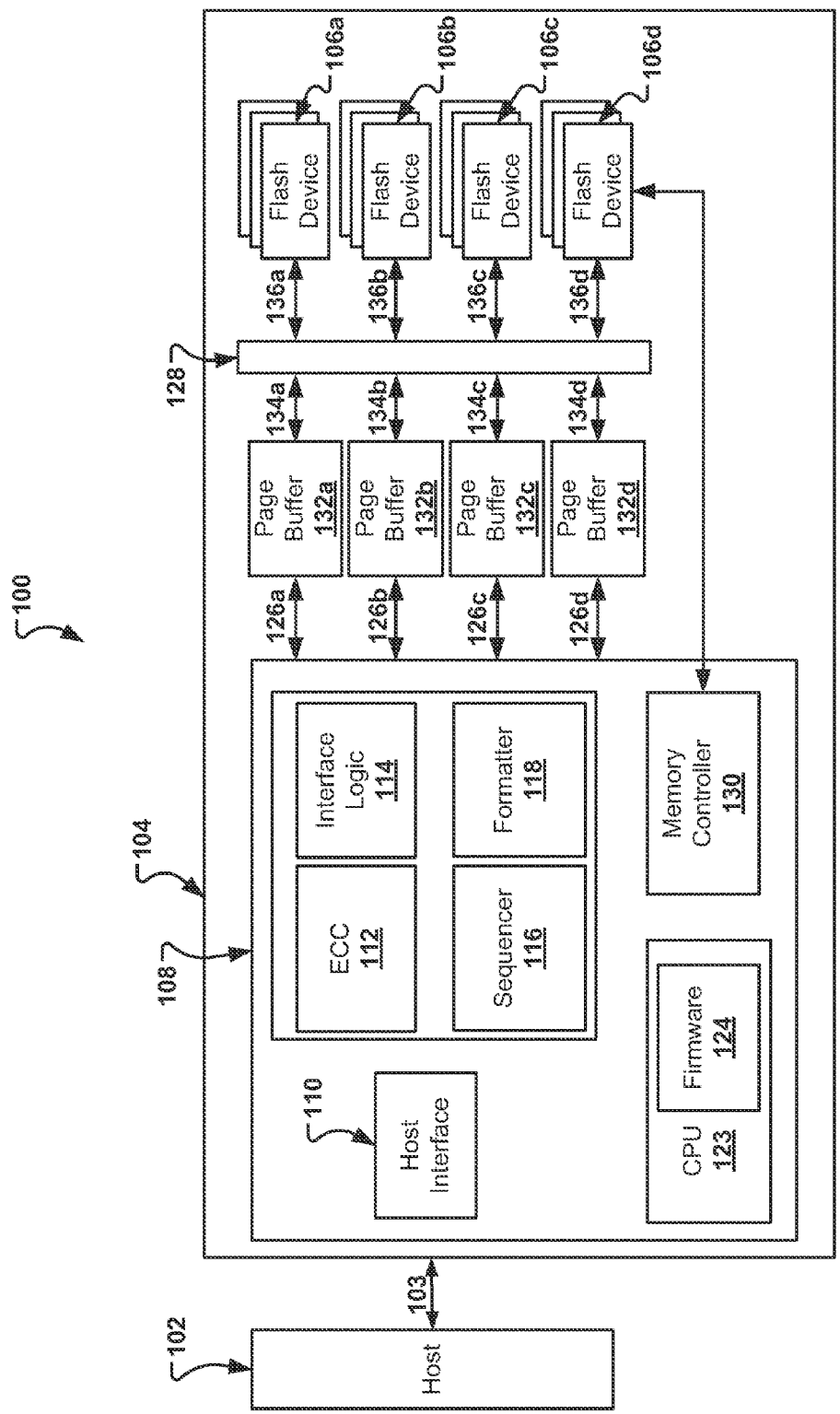
FIG. 1A shows an example of a solid state drive system.

Flash memories are commonly structured as rectangular arrays of memory cells. The cells are arranged in orthogonal bit lines and word lines. One or more bits of data are written to each cell by injecting sufficient electrical charge into a floating gate of the cell to place the cell's threshold voltage within a range of threshold voltages that represents the value of that bit or of those bits. A flash memory cell is then subsequently read by comparing its threshold voltage to reference voltages that mark the boundaries between threshold voltage ranges. For a NOR flash memory, the cells are written and read individually. For a NAND flash memory, the cells are written and read one page at a time, with each word line including a small integral number (typically one or two, generally no more than four) of pages. The word lines are grouped further into blocks, such that cells are erased an entire block at a time.

However, data read from the cells are sometimes distorted. One such distortion is attributed to effects from the floating gate to floating gate coupling (or simply floating gate coupling). Floating gate coupling can cause unrecoverable errors during read operations which may necessitate an error recovery step during reading. Floating gate coupling arises where the apparent charge stored on the floating gate of a memory cell undergoes an apparent shift (e.g., threshold voltage drift) because of coupling from an electric field resulting from charge stored on a subsequently programmed nearby memory cell's floating gate. While in theory the electric field from a charge on the floating gate of a memory cell may couple to the floating gate of other memory cell in the array, the effect is most pronounced and noticeable with adjacent memory cells. Adjacent memory cells may include neighboring memory cells that are on the same bit line, neighboring memory cells on the same word line, or neighboring memory cells that are on both a neighboring bit line and neighboring word line, and across from each other in a diagonal direction. The apparent shift in charge may result in errors when reading the programmed memory state of a memory cell.

The effects of floating gate coupling are most serious in situations where a memory cell adjacent a target memory cell is programmed subsequent to the target memory cell (e.g., in an odd/even word/bit line architecture). The charge so placed on the floating gate of the adjacent memory cell, or a portion of the charge, may couple to the target memory cell resulting in an apparent shift of the threshold voltage of the target memory cell. This change in the apparent threshold voltage of the memory cell can result in a read error when subsequently reading the target memory cell. For example, a memory cell can have its apparent threshold voltage shifted or drifted to such a degree after being programmed that the memory cell will not turn on or not turn on to a sufficient degree under the applied reference read voltage for the memory state to which it was programmed. As another example, over time, charge may leak from the floating gates of the memory cells and interfere with the threshold voltage of the target cell. Threshold voltage drift can unexpectedly change the state of the target cell and the data value stored in the target cell that may lead to false reads of the target cell's true state to thereby cause serious data errors. Threshold voltage drift is especially problematic in MLC flash memory where the threshold voltage regions or sub-ranges associated with each programmed state are relatively smaller than those for a typical binary or SLC flash memory.

In some implementations, to minimize floating gate coupling effect and threshold voltage drift, memory cells can be programmed in a predetermined sequence that allows pages with the least significant bit (LSB) and central significant bit (CSB) to be programmed first prior to programming pages with the most significant bit (MSB). This sequence allows neighboring cells (e.g., cells neighboring a target cell) to be programmed first so as to reduce the floating gate coupling effect and threshold voltage drift on the target cell that is to be programmed later.

As used herein, the term "neighboring" does not necessarily mean a cell that is immediately adjacent to a target cell. In some implementations, neighboring cells can include those that are one or more cells away from the target cell. Further, as used herein, MSB refers to a bit in the logic representation of a flash cell incurring a most threshold voltage shift (e.g., in comparison with CSB and LSB) during programming; CSB refers to a bit with an intermediate threshold voltage shift during programming (e.g., lower than MSB but higher than LSB); and LSB refers to a bit with a least threshold voltage shift during programming (e.g., in comparison with MSB and CSB). As an example, for Gray coded mapping of a two-bit-per cell flash memory with state distributions from left to right representing bits of {11}, {10}, {00}, and {01} respectively, a first bit can correspond to the MSB, while a second bit can represent the LSB. As another example, for a three-bit-per-cell flash memory with a state mapping of {111}, {011}, {001}, {101}, {100}, {000}, {010}, and {110}, a first bit can correspond to the LSB (e.g., where LSB programming is the last phase of programming and incurs the least threshold voltage during programming), a second bit can correspond to the CSB, and a third bit in each can correspond to the MSB (e.g., where MSB programming is the first step of programming and incurs the most threshold voltage shift during programming). A binary notation will be used where needed to express MSB/CSB/LSB in a binary representation. In some implementations, MSB and binary MSB may coincide, representing the same bit.

In some implementations, the effects resulting from the floating gate coupling interference and threshold voltage drift also can be reduced by performing additional steps to programming the neighboring word lines. For example, a programming sequence can be executed that includes programming all neighboring word lines first prior to programming the word line associated with a target cell. As will be discussed in greater detail below, in some implementations, the programming sequence can be performed using interleaving, which programs the page(s) stored in the LSBs of the cells, page(s) stored in the CSBs of the cells, and page(s) stored in the MSBs of the cells in a predetermined, mixed order to achieve optimum reduction in signal distortion while maximizing programming speed. In the description that follows, for the sake of brevity, a LSB page refers to a page stored in the LSB of a cell; a CSB page refers to a page stored in the CSB of the cell; and a MSB page refers to a page stored in the MSB of the cell.

FIG. 1A shows an example of a solid state drive system 100. As shown in FIG. 1A, the system 100 includes a host 102 and a solid state drive controller 104. The solid state drive controller 104 can include a host interface 110, a central processor unit (CPU) 123, a memory interface 128, a memory controller 130 and flash memory devices 106a, 106b, 106c and 106d.

The host 102 can communicate with the solid state drive controller 104 through the host interface 110. The host interface 110, in some implementations, can include a Serial Advanced Technology Attachment (SATA) interface or a Parallel Advanced Technology Attachment (PATA) interface. A SATA interface or PATA interface can be used to convert serial or parallel data into parallel or serial data, respectively. For example, if the host interface 110 includes a SATA interface, then the SATA interface can receive serial data transferred from the host 102 through a bus 103 (e.g., a SATA bus), and convert the received serial data into parallel data. In other implementations, the host interface 110 can include a hybrid interface. In these implementations, the hybrid interface can be used in conjunction with, for example, a serial interface.

The host interface 110, in some implementations, can include one or more registers in which operating commands and addresses from the host 102 can be temporarily stored. The host interface 110 can communicate a PROGRAM or READ command to a solid state controller 108 in response to the stored information in the register(s).

As shown in FIG. 1A, the solid state controller 108 can include the host interface 110, an error correction code (ECC) module 112, interface logic 114, a sequencer 116, a formatter 118, a CPU 123 containing embedded firmware 124 by which the solid state controller 108 can be controlled, and a memory controller 130. The CPU 123 can include a microprocessor, a signal processor (e.g., a digital signal processor) or microcontroller. In some implementations, the CPU 123 with the embedded firmware 124 can reside outside of the solid state drive controller 104.

In some implementations, the solid state drive controller 104 can include one or more channels 126a, 126b, 126c and 126d, and each channel 126a-126d can be configured to receive one or more control signals (e.g., four chip-enable signals) or READ, PROGRAM or ERASE data or commands from the host 102 or from the flash memory devices 106a-106d.

The solid state controller 108 can be configured to handle any suitable command, status, or control request for access to the flash memory devices 106a-106d. For example, the solid state controller 108 can be configured to manage and control storage and retrieval of data in the flash memory devices 106a-106d. To initialize a READ, PROGRAM or ERASE operation, the solid state controller 108 can receive one or more service requests or commands (e.g., READ, PROGRAM and ERASE requests) from the host 102 (or from the memory controller 130).

In some implementations, the solid state controller 108 can be a part of a microcomputer system under the control of a microprocessor (not shown). The solid state controller 108 can control the flow of commands and data between the host 102 and the solid state drive controller 104. In some implementations, the solid state controller 108 can include read-only memory (ROM), random-access memory (RAM) and other internal circuits. The solid state controller 108, in some implementations, can be configured to support various functions associated with the flash memory devices 106a-106d, such as, without limitation, diagnosing the flash memory devices 106a-106d, sending commands (e.g., activation, READ, PROGRAM, ERASE, pre-charge and refresh commands) to the flash memory devices 106a-106d, and receiving status from the flash memory devices 106a-106d. The solid state controller 108 can be formed on a same or different chip as the flash memory devices 106a-106d or on a same chip. The solid state controller 108 also can be formed on a same or different chip as the solid state drive controller 104.

The flash memory devices 106a-106d can be coupled with the memory interface 128. In some implementations, if the flash memory devices 106a-106d include NAND-type memory devices, the memory interface 128 can be a NAND flash input/output interface.

In some implementations, the solid state drive controller 104 (and/or the host 102) can be mounted on a system on-chip (SOC). The SOC, in these implementations, can be fabricated using, for example, a digital process. The SOC can include an embedded process system (e.g., an embedded CPU) separate from the CPU 123 in the solid state drive controller 104. The SOC also can include a SRAM (Static Random Access Memory), system logic, cache memory and cache controller for processing program code and data. The program code and data associated with the embedded process system can be stored in the flash memory devices 106a-106d, and communicated to the SOC through, for example, an SOC interface (not shown). The SOC interface can be used by a translator for translating information flowing between the interface and the internal bus structure of the SOC. Control signals can flow from the SOC to the flash memory devices 106a-106d while instructions and data can flow from the flash memory devices 106a-106d to the SOC during READ operations. Instructions and data also can be sent to the flash memory devices 106a-106d during PROGRAM operations.

In some implementations, the flash memory devices 106a-106d can be controlled by the memory controller 130. The host 102 can communicate with the flash memory devices 106a-106d through the memory controller 130. The memory controller 130 can be connected to the flash memory devices 106a-106d through a corresponding pin or terminal. In these implementations, the memory controller 130 can be implemented as an application specific integrated circuit (ASIC) or as an SOC.

Additionally or alternatively, the host 102 can communicate with the flash memory devices 106a-106d through the solid state controller 108. For example, the host 102 can transmit one or more commands to the solid state controller 108, and through the memory interface 128, the solid state controller 108 can send the host's commands to the flash memory devices 106a-106d. The memory interface 128 can be a NAND flash I/O interface. The NAND flash interface can include one or more pins each corresponding to a specific function, as will be discussed in greater detail below.

In some implementations, the flash memory devices 106a-106d can be coupled with a plurality of page buffers 132a, 132b, 132c and 132d. In some implementations, each flash memory device 106a-106d can be associated with a respective page buffer 132a-132d. For example, as illustrated in FIG. 1A, the flash memory device 106a can be associated with the page buffer 132a; the flash memory device 106b can be associated with the page buffer 132b; the flash memory device 106c can be associated with the page buffer 132c; and the flash memory device 106d can be associated with the page buffer 132d. If desired, each flash memory device 106a-106d also can be associated with more than one page buffer.

In some implementations, the page buffers 132a-132d can be used as a temporary storage during PROGRAM/READ operations on the memory cells of the selected page. Each page buffer 132a-132d can have a storage capability at least equal to the storage capability of a memory page (e.g., 2 Kb).

Each page buffer 132a-132d can store one page of write data to be programmed into one page of flash memory cells. Each page buffer 132a-132d can include, without limitation, registers, sense circuits for sensing data read from one page of flash memory cells, verify logic, latching circuits or writing drivers. During PROGRAM operations, each page buffer 132a-132d can latch PROGRAM data received over a respective channel 126a-126d, and transfer the latched data to the respective flash memory device 106a-106d. Each page buffer 132a-132d also can perform program verify operations to ensure that the programmed data has been properly programmed into the flash memory devices 106a-106d.

As discussed above, the page buffers 132a-132d can be connected to the solid state controller 108 through respective channels 126a-126d. In some implementations, the page buffers 132a-132d also can be connected to the memory interface 128 through respective channels 134a, 134b, 134c and 134d, and to the flash memory devices 106a-106d through channels 136a, 136b, 136c and 136d. In some implementations, both the memory interface 128 and the page buffers 132a-132d can be formed as internal components of the solid state drive controller 104 or the solid state controller 108. In other implementations, the page buffers 132a-132d can be formed as external components to the solid state drive controller 104 or the solid state controller 108.

To select a particular page buffer 132a-132d for storing PROGRAM data, input (e.g., user input or input provided by software programs) can be received through a double data rate (DDR) interface (not shown), which can be error-corrected by the ECC module 112. For READ data, the ECC module 112 can be used to correct any error present in the READ data retrieved from the flash memory devices 106a-106d. For PROGRAM data, the ECC module 112 can be used to add one or more redundant bits to the PROGRAM data. Once the PROGRAM data is written, the redundant bits allow error-correction to be performed in a subsequent READ cycle of the written PROGRAM data. The ECC module 112 can first select a set of data to be rewritten to the flash memory devices 106a-106d, add redundant data to the selected set of data, and pass the selected set of data with the redundant information to the flash memory devices 106a-106d through a corresponding channel 126a-126d (e.g., following a firmware request order issued by the firmware 124). Output of the ECC module 112 then can be used as a SELECT signal to designate a page buffer 132a-132d for a particular PROGRAM operation.

In some implementations, the flash memory devices 106a-106d can be multi-plane memory devices each including, for example, four planes. Each flash memory device 106a-106d also can include a non-volatile (or volatile) memory (e.g., a single-level flash memory or a multi-level flash memory). In some implementations, the nonvolatile memory can include a NAND-type flash memory module. A NAND-type flash memory module can include a command/address/data multiplexed interface such that commands, data, and addresses can be provided through corresponding input/output pins. Advantages of using NAND-type flash memory devices as the flash memory devices 106a-106d include, without limitation, faster boot and resume times; longer battery life; and higher data reliability.

Each flash memory device 106a-106d can be connected to a respective channel 126a-126d. Each channel 126a-126d can support, for example, one or more input and output lines, chip select signal lines, chip enable signal lines and the like. The channel also can support other signal lines such as, without limitation, write enable, read enable, read/busy output, and reset signal lines. To increase the degree of parallelism, each flash memory device 126a-126d can have its own channel connected to the solid state drive controller 104 as shown in FIG. 1A. For example, flash memory device 106a can be connected to the solid state drive controller 104 using channel 126a; flash memory device 106b can be connected to the solid state drive controller 104 using channel 126b; flash memory device 106c can be connected to the solid state drive controller 104 using channel 126c; and flash memory device 106d can be connected to the solid state drive controller 104 using channel 126d. In other implementations, the flash memory devices 106a-106d can share a common channel.

The flash memory devices 106a-106d can be connected to the solid state drive controller 104 via standard interfaces such as an Open NAND Flash Interface (OFNI). For the host-to-drive connection, standard connectors can be used that include, without limitation, SATA, USB (Universal Serial Bus), SCSI (Small Computer System Interface), PCM-CIA (Personal Computer Memory Card International Association), and IEEE-1394 (Firewire).

Each flash memory device 106a-106d can include one or more flash dies, each being selected using a chip enable signal or chip select signal. A solid state storage die can be partitioned into planes, blocks and pages. In some implementations, a page can have a capacity of 2 Kbytes, 4 Kbytes, 8K bytes or 16 KB. In some implementations, each flash die can be configured as a single bit cell (SLC) or multi-level cell (MLC). with a corresponding command.

As will be discussed in greater detail below, each flash cell's threshold voltage generally determines the data value that is stored in the cell. For example, in a SLC memory device, a threshold voltage of 0.5V can indicate a programmed cell (e.g., logical {0} state) while a threshold voltage of −0.5V can indicate an erased cell (e.g., logical {1} state). The SLC or MLC devices can be selected using a chip enable signal or chip select signal, which can be generated by the solid state controller 108 using a combination of control and address information received from the host 102.

Where multiple flash dies are used, in some implementations, the solid state drive controller 104 can access more than one die in a same flash memory device at the same time. The solid state drive controller 104 also can access different dies in different flash memory devices at the same time. The capability to access more than one die allows the solid state drive controller 104 to fully utilize the available resources and channels 126a-126d to increase the overall performance of the solid state drive controller 104. Further, where the flash memory devices 106a-106d share a same memory input/output line and control signal (e.g., chip enable signal), the number of pins of the solid state controller 108 can be reduced to further minimize the cost for manufacturing the solid state drive controller 104.

A flash memory array of a flash memory device 106a-106d can typically be organized into bits, bytes, or pages. For example, a flash page can include a user portion containing 2 k bytes (or 2 kB), and a spare portion containing 64 bytes. The memory array further can be organized into blocks. For example, each block can contain 128 pages.

Each of the flash memory devices 106a-106d can be a multi-plane NAND flash memory device. NAND flash memory devices generally have higher density and lower cost per bit than NOR-type flash memory devices. A NAND flash memory can be coupled with a NAND flash I/O interface that allows sequential access to data. A NAND flash I/O interface can include multiple pins each corresponding to a specific function.

Although the flash memory devices 106a-106d are described herein as NAND-type memory devices, the flash memory devices 106a-106d also can be of the form of any one of a NOR Flash EEPROM (Electrically Erasable Programmable Read-Only Memory), AND Flash EEPROM, DiNOR Flash EEPROM, Serial Flash EEPROM, DRAM (Dynamic Random Access Memory), SRAM (Static Random Access Memory), ROM (Read-only Memory), EPROM (Erasable Programmable Read-Only Memory), FRAM (Ferroelectric Random Access Memory), MRAM (Magnetoresistive Random Access Memory), or PCRAM (Phase-Change Random Access Memory).

A bit, either a zero-bit or a one-bit, can generally be stored in a cell of the flash memory device 106a-106d. A cell is a memory element containing values of one or more data bits. A single-level cell (SLC) stores only one bit of data whereas a multi-level cell (MLC) can store more than one bit by choosing between multiple levels of electrical charge to apply to the floating gate of the cell. For example, while a SLC can be programmed with a logical value of "1" or "0", a MLC can be programmed with a logical value of "11", "10", "01", or "00".

The programmed level (or logical value) of a cell (whether SLC or MLC) can be determined by applying a voltage to the cell's gate and detecting when the cell conducts current. The cell has a certain threshold voltage such that if a voltage above that threshold is applied to the cell's gate, the gate will conduct. Conversely, if a voltage below that threshold is applied to the cell's gate, the gate will not conduct current. As the amount of charge in the cell changes this threshold voltage, the charge may be inferred by determining the level at which voltage the cell starts to conduct current. Thus, the programmed level can be determined by iteratively applying different voltages to the gate and measuring whether the cell conducts.

For example, when a voltage read from a memory cell is greater than 1 V and less than 2 V, it can be determined that data stored in the memory cell has a logic value of "1" (or simply logical "1"). When the voltage read from the memory cell is greater than 3 V and less than 4 V, it can be determined that the data stored in the memory cell has a logic value of "0" (or simply logical "0"). The data stored in the memory cell can be classified depending on the difference between memory cell currents/voltages during the reading operations.

The cell's logical value also can be determined by applying a voltage to the cell above the threshold voltage so that the cell conducts current, and determining the amount of current based on the difference between the applied voltage and the threshold voltage. As the threshold voltage changes as a function of the amount of charge in the cell, the logical value can be determined by measuring the current going through the cell.

Initially, a memory cell operates at a nominal threshold voltage (e.g., representative of one-bit). As an example, after the memory controller 130 performs an erase operation on a memory cell, the memory cell can be re-initialized at the nominal threshold voltage.

To store a zero-bit in a memory cell, a train of programming voltage pulses can generally be applied to inject electrons (e.g., from the cell's silicon substrate through the cell's oxide layer into the cell's floating gate) until the cell's threshold voltage exceeds a reference voltage that represents a zero-bit. The memory cell is then read by comparing the cell's threshold voltage to the reference voltage. If the cell's threshold voltage is below the reference voltage, then the cell is read as a one-bit cell. If the cell's threshold voltage is at or above the reference voltage, then the cell is read as a zero-bit cell.

A process of storing data by changing the threshold voltage of a memory cell can be referred to as "programming". A target threshold voltage of the memory cell can be "programmed" based on the pattern of data to be stored in the memory cell. For example, a target threshold voltage interval of 1-2 volts can be used to program a memory cell with a logical "1" and 3-4 volts to program the memory cell with a logical "0". This voltage range for a specific bit generally differs from application to application, and is not limited to those discussed above.

In an N-bit cell (where N>1), data can typically be stored by programming the cell to one of $2^N$ predefined programming levels, with each level representing a possible combination of values of the N bits. For example, in the case of a two-bit MLC cell (where N=2), any one of four threshold voltage states (e.g., $2^2$=4) can be allocated to the two-bit data representing {11}, {01}, {00} and {10} bits. A first threshold voltage can be allocated to bits {11}, and a second threshold voltage can be allocated to bits {10}. Similarly, a third threshold voltage can be allocated to bits {01}, and a fourth threshold voltage can be allocated to bits {00}.

In the analog context, the first threshold voltage can be one in the lowest threshold voltage range for representing bits {11}, and the second threshold voltage can be one that is greater than the first threshold voltage for representing bits {10}. Similarly, the third threshold voltage can be one that is greater than both the first threshold voltage and the second threshold voltage for representing bits {01}, but less than fourth and the fourth threshold voltage can be one that is the highest in the threshold voltage range for representing bits {00}.

One of the two bits of each cell in a two-bit flash memory can be referred to as a least significant bit (LSB) and the other bit can be referred to as a most significant bit (MSB). In some implementations, the MSB can be programmed into a multi-level cell first, and the LSB can be programmed into the multi-level cell last.

One skilled in the art would recognize that terms such as LSB and MSB are used merely as a way to refer to specific bits of multi-bit memory cells, and do not imply that certain bits are more significant or important than others, outside of the binary number representation context. Of course, any other suitable terminology also can be used for referring to the individual bits stored in the cells. Further, similar schemes can be defined for other types of multi-bit cells storing higher numbers of bits, such as eight-level cells storing three bits per cell (e.g., $2^3$=8) or sixteen-level cells storing four bits per cell (e.g., $2^4$=16).

Since the programming operation of changing the threshold voltage of the memory cell requires a relatively longer time than a read operation of reading data stored in the memory cell, a plurality of memory cells can be simultaneously programmed in order to reduce the associated programming time. A set of memory cells simultaneously programmed can be referred to as a "page". If a MLC flash memory has an array of 512 two-bit cells with a 512-bit page size, then two pages of data can be stored in the array, which storing can be performed in one of two ways. One way is to store all the least-significant bits (LSB) as bits of the first page, and all the most-significant bits (MSB) as bits of the second page. Another way is to store all the bits of the first 256 cells as bits of the first page, and all the bits of the last 256 cells as bits of the second page.

In a typical configuration, the memory cells lie along a given word line (row) of the array and store multiple memory pages. Different bits can be mapped to different pages. For example, in a given word line of a two-bit-per-cell flash memory, a memory page can be stored in the LSBs of the cells and another page can be stored in the MSBs. Similarly, in a three-bit-per-cell memory, the cells positioned along a given word line can store three memory pages, including a LSB page, a central significance bit (CSB) page and a MSB page. The term CSB, as used herein, denotes the bit that is programmed into a three-level cell (e.g., cell storing three bits) second (e.g., after the MSB but before the LSB). One skilled in the art will recognize that where the multi-level cell stores four or more levels, more than one CSB can be used (e.g., C1SB and C2SB) and the use of the term CSB, which implies that the cell is a three-level cell, is merely by way of example and is not intended to be limiting.

Generally, programming a LSB page depends on the value of the MSB that was already written to the cell. For example, to program a LSB to logical {1}, the memory controller 130 can program the cell to the first level if the MSB is currently at logical {1}, and to the second level if the MSB is currently at logical {0}. In practice, however, the previously-written data may not be available when programming subsequent pages. For example, the LSB page of a given word line may not be written until after the MSB page of the same word line had been written.

Therefore, to perform the programming of a second or subsequent page, the storage values from the memory cells are first read. Then, the current programming levels of the cells are reconstructed (e.g., reconstructing the data of a previously written page) such as by comparing the read storage values to one or more read thresholds. The reconstructed data is subsequently cached (e.g., in a page buffer such as page buffers 132a-132d), and the new programming levels for the cells are then determined based on the new data page to be written and on the reconstructed data being cached. Using the new programming levels, the memory cells are then programmed.

As noted above, writing a second (or higher) page to multi-bit memory cells requires the determination of the current programming levels of the cells. However, the storage values read from the cells are often distorted due to interference causing signal distortion, such as cross-coupling interference from neighboring cells, voltage drift due to aging, disturb noise from operations performed on other cells, and the like. Because of these distortion effects, reconstruction of the previously-written data is subject to a certain error probability. When data reconstruction of the previously-written data of a given cell is erroneous, the programming of subsequent, new data to the cell will also be erroneous.

The severity of distortion effects often depend on the time that passed since the cells were last programmed. For example, storage values may drift over time due to charge loss. Neighboring memory cells that cause additional interference may be programmed after the target cell so as to change the threshold voltage of the already-written target cell. Disturb noise may also accumulate over time due to operations applied to other cells in the array. Therefore, the probability of erroneous reconstruction of previously-written pages often increases with the time difference between the programming of these previous pages and the programming of the new page.

In some implementations, such distortions can be reduced by programming the cells in a predetermined sequence that allows MSB pages and CSB pages to be programmed prior to programming the LSB pages. For example, all MSB pages can be programmed first, followed by programming all CSB pages. All LSB pages can be programmed when all (or most) MSB and CSB pages are programmed. In some implementations, when not all pages in a word lines are programmed, the corresponding word line (or flash cell) can be in a "partially" programmed state, as the programming is not yet completed and the threshold voltage may have an intermediate value.

In some implementations, similar results can be achieved using an alternate sequence that can include, completely or partially, programming cells in the neighboring word lines prior to, starting or completing, programming the word line associated with the target cell. For example, the sequence can be performed using interleaving by programming MSB pages in a word line first followed by LSB pages and CSB pages in the neighboring word lines. As will be discussed in greater detail below, programming the neighboring word lines first before the word line of the target cell allows the programming operation of the neighboring word lines to be kept at a minimum, which reduces the impact of the distortion effects caused by the neighboring cells.

Figure 1B:
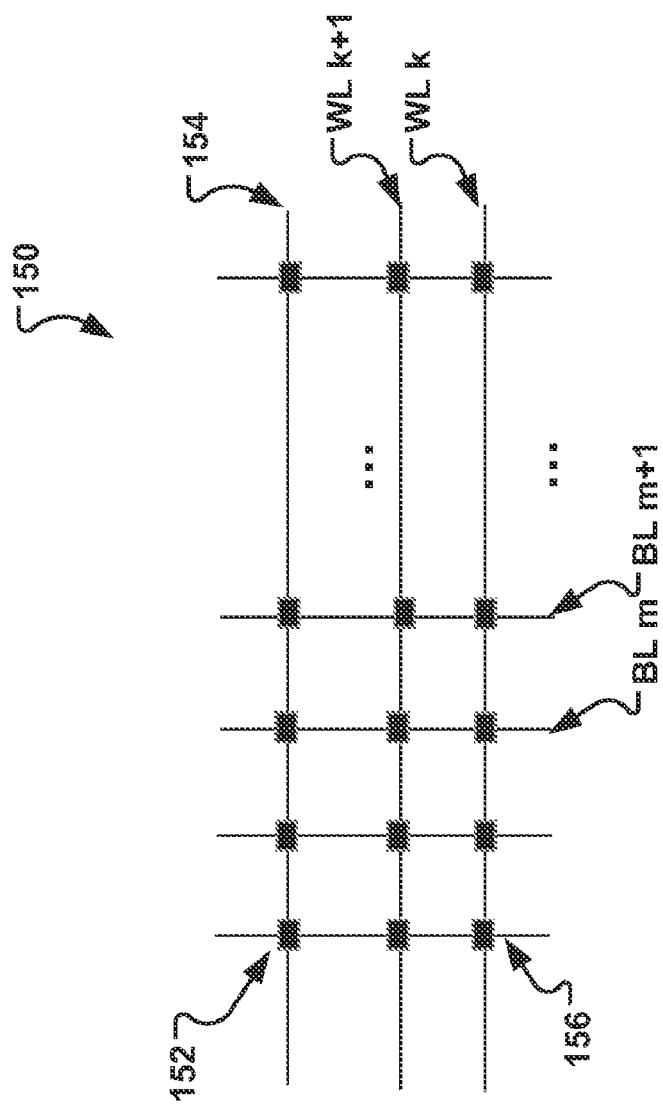
FIG. 1B shows an example of a flash memory array.

FIG. 1B shows an example of a flash memory array. Although FIG. 1B refers to flash memory cells that are connected in a particular array configuration, the principles discussed herein below also are applicable to other types of memory cells and array configurations.

Referring to FIG. 1B, memory cells 152 of memory array 150 are arranged in a grid having multiple rows and columns. Though not illustrated, each cell 152 can include a floating gate transistor. A certain amount of electrical charge (electrons or holes) can be stored in a particular cell by applying appropriate voltage levels to the transistor gate, source and drain. The value stored in the cell can be read by measuring the threshold voltage of the cell. The threshold voltage is the minimal voltage that needs to be applied to the gate of the transistor in order to drive the transistor to a conduction state. The read threshold voltage can then be used to indicate the charge stored in the cell.

The gates of the transistors in each row can be connected by a respective word line 154 (e.g., WL k, WL k+1, ..., where $k \geq 0$ and is an integer), and the sources of the transistors in each column can be connected by a bit line 156 (e.g., BL m, BL m+1, ..., where $m \geq 0$ and is an integer). Where NOR cells are used, the sources can be connected to the bit lines 156 directly, and where NAND cells are used, the bit lines 156 can be connected to strings of floating-gate cells.

As discussed previously, a memory cell array can be divided into multiple pages, (e.g., groups of memory cells that are programmed and read simultaneously). Pages are sometimes sub-divided into sectors. In some implementations, each page can include an entire row (word line) of the array. In other implementations, each row can be divided into two or more pages. For example, each row can be divided into two pages with one including the odd-order cells and the other including the even-order cells. In some implementations, a two-bit-per-cell flash memory can include four pages per row; a three-bit-per-cell flash memory can include six pages per row; and a four-bit-per-cell flash memory can include eight pages per row.

Erasing of cells can be carried out in blocks that contain multiple pages. A flash memory can include several hundred or thousand erasure blocks. In a typical two-bit-per-cell flash memory, each erasure block can be on the order of thirty-two word lines, each including several hundreds or thousands of cells. Each word line can be partitioned into four pages (e.g., odd/even order cells, and least/most significant bit of the cells). Similarly, a three-bit-per-cell flash memory can include thirty-two word lines per erasure block and one hundred ninety two pages per erasure block, while a four-bit-per-cell flash memory can include two hundred fifty six pages per erasure block.

For MLC flash memory, multiple memory pages can be mapped to a single group of cells such that each page can be mapped to a certain bit. For example, as discussed above, in an eight-level three-bit-per-cell memory, one page can be stored in the LSB of the cells; another page can be stored in the CSB of the cells; and yet another page can be stored in the MSB of the cells.

To program the memory cells, in some implementations, all MSB pages in a block can first be programmed. Once the programming of the MSB pages in the block is completed or nearly completed, the programming for all CSB pages in a block can be executed. When the programming of the MSB and CSB pages is completed, the programming of the LSB pages in the block can be performed.

In some implementations, the word lines of the neighboring cells can be completely programmed first prior to programming the target cell. After the word lines of the neighboring word lines are nearly or completely programmed, the number of programming operations associated with the neighboring cells can be kept at a minimum. In doing so, undesired distortion that is causing the adverse effects, such as floating gate coupling and threshold voltage drift, can be minimized so as to provide accurate programming, decoding and reading in the subsequent data reading phases.

Figure 3:
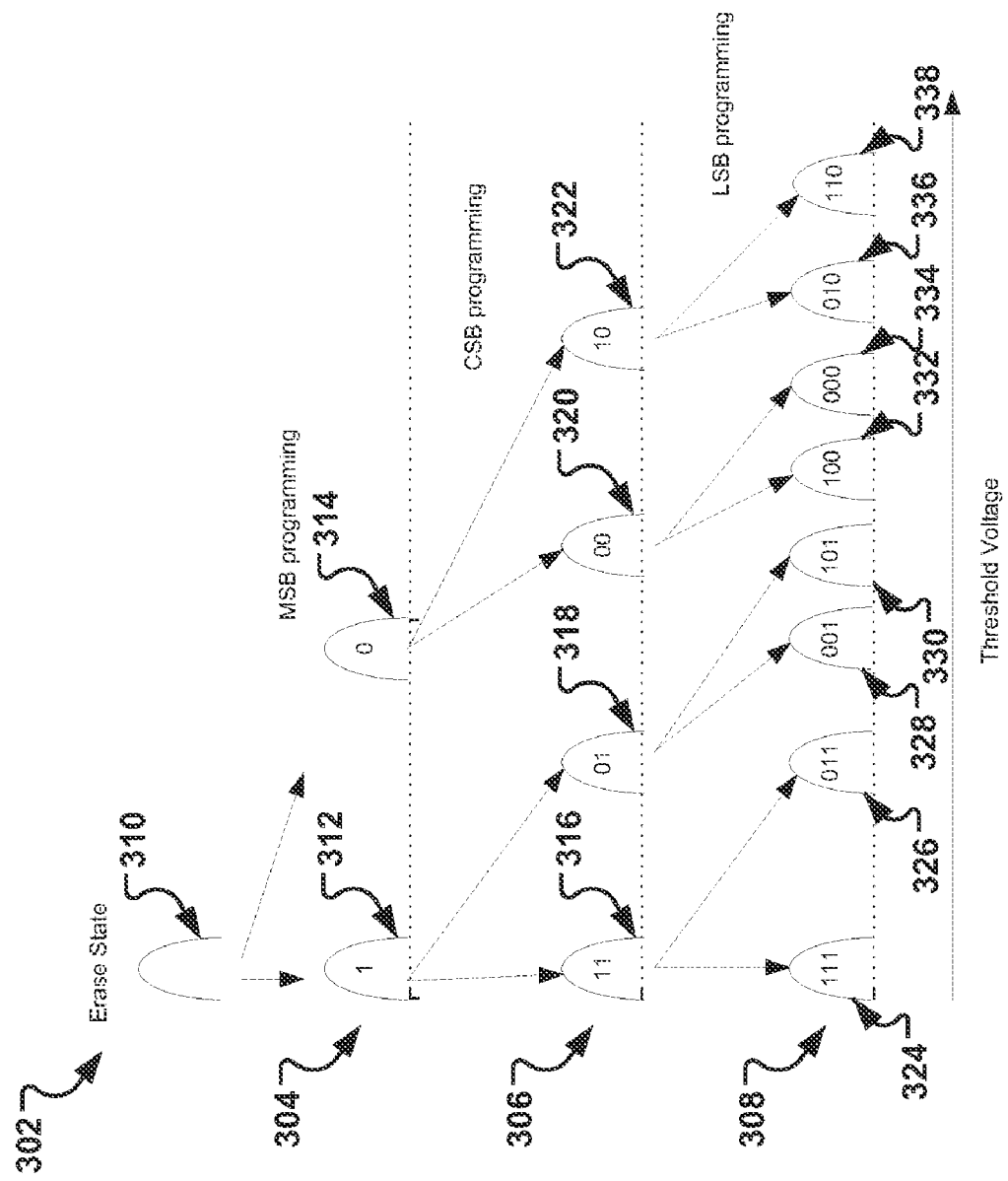
FIG. 3 is a graph showing threshold voltage distributions in multi-level analog memory cells for a three-bit flash memory.

FIG. 3 is a graph showing threshold voltage distributions in multi-level analog memory cells for a three-bit flash memory. It should be recognized that the programming sequence to be discussed herein below is not limited to a three-bit flash memory, and is equally applicable to other sizes of memory cells (e.g., two-bit or four-bit flash memory).

As discussed previously, in an N bits/cell memory, data can be stored by programming each memory cell to one of $2^N$ predefined programming levels, with each level representing a possible combination of values of the N bits. In the example shown in FIG. 3, for a three-bit cell memory, the cells can be eight-level cells ($2^3=8$), with each cell capable of storing three bits and whose programming levels can be mapped to provide the bit patterns of {111}, {011}, {001}, {101}, {100}, {000}, {010}, and {110}, in ascending order of storage values. In some implementations, the first bit to be written to the cells can be the LSB bit in the conventional binary bit context (but defined herein as MSB to avoid confusion of the order in which the bits are programmed), the second bit to be written to the cells can be the CSB, and the third bit to be written to the cells can be the MSB (binary).

Initially, the memory controller 130 can set a target threshold voltage interval of each of the memory cells based on a pattern of data to be programmed in the plurality of memory cells. Each of the memory cells can be erased prior to being programmed. As shown in FIG. 3, cells initially operate in an erase state as illustrated in the distribution diagram 302, which denotes an initialized threshold voltage interval. More specifically, the distribution diagram 302 shows the threshold voltage distribution of the cells when all the cells are erased (e.g., before any programming is performed). At this stage, all the cells assume a single erased level, and the threshold voltages are statistically distributed around the nominal erased level.

The memory controller 130 can perform one or more phases of programming sequences depending on the type of flash memory being used. For example, for a three-bit-per-cell flash memory, the memory controller 130 can perform three phases of programming sequences. Each phase of programming sequence can involve programming a designed set of cells with a particular threshold voltage level.

In FIG. 3, the distribution diagram 304 shows a distribution of the threshold voltage after the memory controller 130 completes a first phase of programming sequence. In the first phase of programming sequence, only the LSBs are programmed. The memory controller 130 can identify a set of memory cells with a threshold voltage that is to be changed. The set of memory cells can include memory cells designated for storing logical ones and zeros.

At the first phase, adjacent programming levels in MSB programming can differ by one MSB (e.g., {1} and {0}). Similarly, adjacent programming levels in CSB programming can differ by one CSB (e.g., {11} and {01}, and {00} and {10}), and adjacent programming levels in LSB programming can differ by one LSB (e.g., {111} and {011}, {001} and {101}, {100} and {000} and {010} and {110}). In general, each programming level can represent a certain combination of N-bit values. Determining the programming level assumed by a given cell can then be performed by reading the N data bits stored in the cell.

In some implementations, the memory controller 130 can adjust the threshold voltage of each of the identified memory cells (e.g., by adding charge to the respective cells) to correspond to a distribution corresponding to the stored data. For example, the memory controller 130 can program a set of memory cells (e.g., by adding charge thereto) with the voltage distribution 312 corresponding to logical "1" (e.g., cells to be programmed with logical "1"), and another set of memory cells with the voltage distribution 314 corresponding to logical "0" (e.g., cells to be programmed with logical "0").

The distribution diagram 306 shows a distribution of the threshold voltage after the memory controller 130 completes a second phase of programming sequence. Among the cells with the voltage distribution 312 corresponding to logical "1", the memory controller 130 can program one set of cells with the voltage distribution 312 to form the voltage distribution 316 corresponding to logical "11", and another set of cells to form the voltage distribution 318 corresponding to logical "01".

Similarly, among the cells with the voltage distribution 314 corresponding to logical "0", the memory controller 130 can program one set of cells with the voltage distribution 320 to form the voltage distribution 320 corresponding to logical "00", and another set of cells to form the voltage distribution 322 corresponding to logical "10".

The distribution diagram 308 shows a distribution of the threshold voltage after the memory controller 130 completes a third phase of programming sequence. Among the cells with the voltage distribution 316 corresponding to logical "11", the memory controller 130 can program one set of cells with the voltage distribution 316 to form the voltage distribution 324 corresponding to logical "111", and another set of cells to form the voltage distribution 326 corresponding to logical "011".

Similarly, among the cells with the voltage distribution 318 corresponding to logical "01", the memory controller 130 can program one set of cells with the voltage distribution 318 to form the voltage distribution 328 corresponding to logical "001", and another set of cells to form the voltage distribution 330 corresponding to logical "101".

Further, among the cells with the voltage distribution 320 corresponding to logical "00", the memory controller 130 can program one set of cells with the voltage distribution 320 to form the voltage distribution 332 corresponding to logical "100", and another set of cells to form the voltage distribution 334 corresponding to logical "000".

Similarly, among the cells with the voltage distribution 332 corresponding to logical "10", the memory controller 130 can program one set of cells with the voltage distribution 332 to form the voltage distribution 336 corresponding to logical "010", and another set of cells to form the voltage distribution 338 corresponding to logical "110".

As shown in FIG. 3, the MSB of each cell can first be programmed (e.g., during the first phase of programming sequence) so that all MSB of pages can be completed prior to programming the CSB and LSB. At the second phase of programming sequence, CSB programming can be executed to program all CSB pages, which include programming cells with logical "1" to logical "11" and "01", and logical "0" to logical "00" and "10". At the third and last phase of programming sequence, LSB programming can be executed to program all LSB pages, which results in cells with logical "11" being programmed to logical "111" and logical "011"; logical "01" to logical "001" and logical "101"; logical "00" to logical "100" and logical "000"; and logical "10" to logical "010" and logical "110".

By programming the cells in the above manner, programming operations of neighboring cells (e.g., cells neighboring a target cell) that cause the most significant floating gate coupling effect and threshold voltage drift can be performed prior to final programming operations of the target cell. The coupling effect to the target cell is proportional to the threshold voltage shift of the neighboring cells. In particular, a target cell's threshold voltage shifts proportional to the programming threshold voltage shift in its neighboring cell if the neighboring programming operation is performed after that of the target cell. However, since the programming process itself is an iterative process, where charges may be added to the floating gate on a step-by-step basis until a desired target is met, any prior programming disturbance from the neighboring cells will be taken into account during programming of the target cell. This program-and-verify procedure nullifies any such disturbance, provided that the disturbance does not cause overshoot of the threshold voltage. For example, as shown in FIG. 3, the first phase (MSB programming) incurs the most threshold voltage shift (or floating gate charge increase), the second phase (CSB programming) incurs medium threshold voltage shift, and the third phase (LSB programming) incurs the least threshold voltage shift. By programming the cells in the above manner, the MSB and CSB programming operations of the neighboring cells can be completed prior to the LSB programming of the target cell. Thus, after the programming is finished in the target cell, its threshold voltage is only subject to programming disturbance (gate coupling) from the LSB programming in the neighboring cells, which is the least among all programming operations. Consequently, the floating coupling effect and the threshold voltage shift can be minimized, comparing to the manner of finishing all MSB/CSB/LSB in a cell and subsequently proceeding to the neighboring cell.

As will be appreciated, the threshold voltage of a cell that was programmed with only one bit can generally be lower than the threshold voltage of the cell after programming both bits. A group of cells in which only the first bits are programmed has, on average, lower storage values than a group of cells that is fully-programmed. In other words, cells that are partially-programmed can have lower analog storage values than cells that are fully-programmed.

As discussed previously, a memory array typically includes a large number of memory cells that are arranged in rows and columns. The cells along each row can be connected to a word line (e.g., word line 154), and the cells along each column can be connected to a bit line (e.g., bit line 156). A page of data is typically written simultaneously to a group of cells along a word line. In some memory configurations, each word line can store a single page. In other configurations, different bits of a MLC can be mapped to different pages. For example, in a group of two-bit-per-cell flash memory, one page can be stored in the LSBs of the cells and another page can be stored in the MSBs.

Generally, rows of memory cells can be programmed starting with a specific word line (e.g., WL k). Programming generally proceeds sequentially thereafter (WL k, WL k+1, WL k+2, etc.) such that at least one page of data is programmed in an adjacent word line (e.g., WL k+1) after completing programming (e.g., after placing each cell of the word line into its final state) of the preceding word line (e.g., WL k). Due to the floating gate coupling effect, such a pattern of programming may result in an apparent shift of the threshold voltage of the memory cells after the cells have been programmed. For every word line except the last word line to be programmed, an adjacent word line is generally programmed subsequent to completing programming of a target word line. However, this programming sequence may increase the charge added to the floating gates of memory cells on the adjacent, later programmed target word line, and affect the threshold voltage of the memory cells on the target word line.

In some implementations, an alternate programming sequence can be implemented in which the lower order bits within a target word line are programmed first. The highest-significant (binary) bits (e.g., MSBs (binary) and CSBs (binary)) can be programmed only after programming of the lower-significant (binary) bits (e.g., LSBs (binary) and CSBs (binary)) is completed (e.g., for all cells) in the target word line. In programming the higher-significant bits, the lower-significant bits of neighboring word lines also are considered. By ensuring that the higher programming levels are programmed after the lower programming levels are programmed in the manner discussed above, the programming sequence ensures that when the target word line is programmed, potentially-interfering cells in the neighboring word lines are already partially programmed when the target cells are programmed to their final values so as to minimize the floating gate interference.

TABLE 1

| WORD LINE | LSB | CSB | MSB |
| --- | --- | --- | --- |
| WL(N) | LSB-(N) | CSB-(N) | MSB-(N) |
| ... | ... | ... | ... |
| WL(3) | LSB-(3) | CSB-(3) | MSB-(3) |
| WL(2) | LSB-(2) | CSB-(2) | MSB-(2) |
| WL(1) | LSB-(1) | CSB-(1) | MSB-(1) |
| WL(0) | LSB-(0) | CSB-(0) | MSB-(0) |

TABLE 1 shows a list of word lines and corresponding bits for a three-bit flash memory. Referring to TABLE 1 above, using the programming sequence described above, the MSBs of all cells in a target word line (e.g., WL k) can be programmed first. Then, MSB pages in neighboring word lines (e.g., WL k+1 and WL k−1) are programmed. Once the MSB pages in the neighboring word lines are programmed, the memory controller 130 can proceed with programming the CSB pages of the target word line. Upon completing programming both the MSB and CSB pages in the neighboring word lines, the LSB pages in the target word line can then be programmed.

For example, rows of memory cells can be programmed starting with the word line WL(0). The memory controller 130 can program the MSB-(0) page in word line WL(0) first. Then, the MSB-(1) page in word line WL(1), which neighbors the MSB-(0) page in word line WL(0), can be programmed. Having completed the programming of the MSB-(1) page in the neighboring word line WL(1), the memory controller 130 can now program the CSB-(0) page in word line WL(0). At this time, the MSB-(2) page in word line WL(2), which neighbors the MSB-(1) page in word line WL(1), can be programmed, followed by programming of the CSB-(1) page in word line WL(1) (e.g., in preparation for programming LSB-(0)). With the programming for pages of the lower-significant bits of the target word line WL(0) (e.g., MSB-(0) and CSB(0)) including those of the neighboring word lines completed (e.g., MSB-(1) and CSB-(1) in word line WL(1)), the memory controller 130 can complete the programming of the target word line WL(0) by programming the LSB-(0) page at the highest-significant binary bit. The aforementioned sequence can be repeated in the same manner for each word line until all N word lines have been programmed.

While the example provided above shows that the word lines are programmed in a monotonically-increasing order starting from word line WL(0), the programming sequence also can be reversed so that word line WL(0) is the last word line to be programmed (e.g., in a monotonically-decreasing order). Also, while the example provided above describes a N-bit flash memory in which the first N−1 bits of all cells are programmed first with the N-th bit (e.g., MSB) of the cells in a given word line being programmed only after programming of the first N−1 bits is completed, in some implementations, the order in which the pages in a given word line are programmed also can be re-arranged without deviating from the principle described herein. For example, depending on the state mapping, LSB (binary) pages can be programmed first, followed by CSB (binary) pages and lastly, MSB (binary) pages.

While FIG. 3 is described with respect to a three-bit flash memory, the programming sequence described herein also is applicable to a four-bit flash memory. In a four-bit flash memory, sixteen different states can be used to represent logical {1111}, {1110}, {1100}, {1101}, {1001}, {1000}, {1010}, {1011}, {0011}, {0010}, {0000}, {0001}, {0101}, {0100}, {0110}, and {0111}. Similar to states used in a three-bit flash memory, each state used in a four-bit flash memory can be specified in gray code format. For example, as between two adjacent states, only one bit is different while the remaining bits remain the same (e.g., {1111} and {1110}).

TABLE 2

| WORD LINE | LSB | C2SB | C1SB | MSB |
| --- | --- | --- | --- | --- |
| WL(N) | LSB-(N) | C2SB-(N) | C1SB-(N) | MSB-(N) |
| ... | ... | ... | ... | ... |
| WL(3) | LSB-(3) | C2SB-(3) | C1SB-(3) | MSB-(3) |
| WL(2) | LSB-(2) | C2SB-(2) | C1SB-(2) | MSB-(2) |
| WL(1) | LSB-(1) | C2SB-(1) | C1SB-(1) | MSB-(1) |
| WL(0) | LSB-(0) | C2SB-(0) | C1SB-(0) | MSB-(0) |

TABLE 2 shows a list of word lines and corresponding bits for a four-bit flash memory. Referring to TABLE 2 above, in a four-bit flash memory, two central-significant bits (e.g., C1SB and C2SB where C1SB is a bit in a higher order than CS2B) can be used to represent data stored between the LSB and the MSB. As shown, the programming can be performed in the all MSB pages, followed by all C1SB, C2SB and LSB pages sequentially in this order.

In general, whether MSB or LSB pages are to be programmed first is dependent upon the state mapping used. Once the state mapping has been selected, the programming sequence can then be configured to program either LSB (binary) or MSB (binary) first.

In a four-bit flash memory, MSBs of all cells in a target word line (e.g., WL k) can be programmed first. Then, C1SB pages in neighboring word lines (e.g., WL k+1 and WL k−1) are programmed, followed by C2SB pages. Upon completing programming both the C1SB and C2SB pages in the neighboring word lines, the LSB pages in the target word line are then programmed.

For example, the memory controller 130 can start with word line WL(0) and program the MSB-(0) page in word line WL(0) first, followed by the MSB-(1) page that is adjacent to the MSB-(0) page. Then, the memory controller 130 can proceed with programming the C1SB-(0) page, followed by the MSB-(2) page in word line WL(2) next and the C1SB-(1) page in word line WL(1) last.

It should be noted that the foregoing sequence (or the sequence below) is not limited to those described, and any sequence of programming is permitted as long as the programming of neighboring cell (word line) of a higher amount of threshold voltage shift is performed before programming of the target cell of a lower amount of threshold voltage shift. For example, using the sequence described above, the C1SB-(0) page can be programmed after the MSB-(2) page.

With both the C1SB-(0) page and the C1SB-(1) page programmed, the memory controller 130 can proceed with the next tier of sequence by programming all C2SB pages that can create floating gate coupling interference with word line WL(0). Specifically, the memory controller 130 can now program the C2SB-(0) page, and concurrently or sequentially, program the MSB-(3) page in word line WL(3) and the C1SB-(2) page in word line WL(2). The programming for the C2SB-(1) page can be performed once the programming for the MSB-(3) page in word line WL(3) and the C1SB-(2) page in word line WL(2) is completed.

With the programming for pages of the higher-significant bits of the target word line WL(0) (e.g., MSB-(0), C1SB-(0), and C2SB-(0)) including those of the neighboring word lines completed (e.g., MSB-(1), C1SB-(1), and C2SB-(1) in word line WL(1)), the memory controller 130 can complete the programming of the target word line WL(0) by programming the LSB-(0) page at the lowest-significant bit.

While the example provided above for a four-bit flash memory shows that the word lines are programmed in a monotonically-increasing order starting from word line WL(0), the programming sequence also can be reversed so that word line WL(0) is the last word line to be programmed (e.g., in a monotonically-decreasing order). Also, depending on the application, LSB (binary) pages can be programmed first, followed by C2SB (binary) pages, C1SB (binary) pages and MSB (binary) pages in that order.

As discussed previously each memory controller 130 can be associated with the page buffers 132a-132d that can be used as a temporary (or permanent) storage during PROGRAM/READ operations on the memory cells of a particular page. However, inter-cell and floating gate interferences (e.g., during programming) can significantly degrade data reliability if proper compensation is not provided by the memory controller 130. To minimize or compensate for such programming interferences, the memory controller 130 can use the page buffers 132a-132d to buffer the host data to be written during the PROGRAM operations, and subsequently issue the corresponding appropriate programming command sequence to each flash memory device 106a-106d.

However, as the number of flash memory devices increases, so does the number of page buffers needed to provide adequate capacity for storing temporary pages of data. The increase in both the number of flash memory devices and page buffers can complicate the circuit logistics and overwhelm the buffering requirements of the memory controller 130. In some implementations, write precompensation techniques and/or interleaving writing (as discussed above) can be performed through the use of a buffer memory (e.g., as opposed to by the memory controller 130). In some implementations, the buffer memory can be added to each of the flash memory devices 106a-106d. In some implementations, the buffer memory can be at least twice as large as the programming unit size of the respective flash memory device 106a-106d. For example, for a three-bit-per-cell flash memory, to accommodate the programming sequence described above, a buffer of nine pages can be used as the memory controller 130 looks ahead three word lines (nine pages in total) of data during programming. This is particular useful when the memory controller 130 encodes the user data in unit of one word line (e.g., 3 pages) at a time. As will be discussed in greater detail below, interference minimizing programming can be performed by each of the flash memory devices 106a-106d by exploiting the buffer memory inside the respective flash memory device 106a-106d.

The addition of a buffer memory to each flash memory device 106a-106d can alleviate the memory controller 130 from work overload and programming delay arising from overwhelmed buffers 132a-132d. The use of a buffer memory also gives the memory controller 130 the additional flexibility to offload programming precompensation for minimizing programming interference to the flash memory devices 106a-106d, which further simplifies the design of the memory controller 130 while enhancing the capability of the memory controller 130 over memory devices utilizing different technology.

Figure 1C:
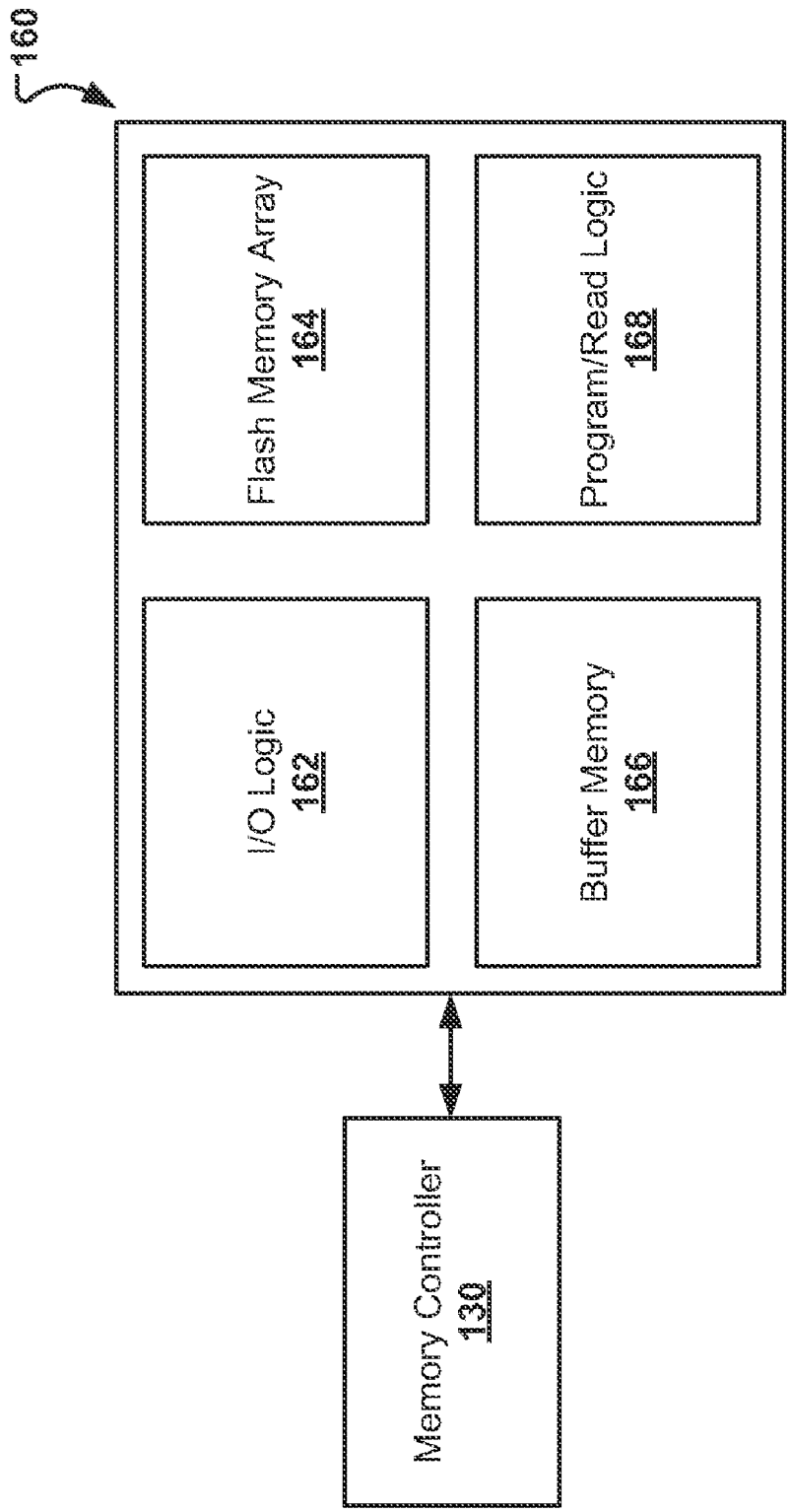
FIG. 1C shows an example of a flash memory device having a buffer memory.

FIG. 1C shows an example of a flash memory device having a buffer memory. Referring to FIG. 1C, the memory controller 130 can be in communication with a flash memory device 160 that includes internal input-output (I/O) logic 162, flash memory array 164, and program/read logic 168. In some implementations, in lieu of or in addition to the page buffers 132a-132d, each flash memory device 106a-106d can include a buffer memory 166. The memory controller 130 can be configured to write data into the buffer memory 166 through the I/O logic 162. The buffer memory 166, in some implementations, can provide a buffer capacity of multiple pages.

In some implementations, the memory controller 130 can be configured to write data into the buffer memory 166 in the same order as the program/read logic 168 programming data into the flash memory array 164. In other implementations, the program logic 168 can program data into the flash memory array 164 in an order that is different from the order that the data is written into the buffer memory 166.

As already discussed, a two-bit-per-cell flash memory can have two pages of data stored in the flash memory array 164, which can be performed in one of two ways. For example, all the least-significant bits (LSB) can be stored as bits of a first page of the two pages, and all the most-significant bits (MSB) can be stored as bits of a second page of the two pages.

| Host Page Number | H0, H1 | H2, H3 | H4, H5 | ... |
|---|---|---|---|---|
| Word line and MSB/LSB page | 0 (MSB/LSB) | 1 (MSB/LSB) | 2 (MSB/LSB) | ... |

TABLE 3 shows an example of a data page organization and corresponding store location. Referring to TABLE 3 above, a table of host page number and corresponding word line are listed. As shown, data in the first word line (e.g., word line "0") can be stored as bits in a first page and a second page (e.g., with host page numbers "H0" and "H1"). Similarly, data in the second word line (e.g., word line "1") can be stored as bits in a third page and a fourth page (e.g., with host page numbers "H2" and "H3"), and data in the third word line (e.g., word line "2") can be stored as bits in a fifth page and a sixth page (e.g., with host page numbers "H4" and "H5").

In some implementations, data from the host can be written into the buffer memory 166 in a predetermined sequence that further minimizes undesired distortions discussed above. In some implementations, a programming sequence can be implemented that allows MSB pages (and CSB pages if a three-bit-per cell flash memory is used) to be programmed prior to programming the LSB pages. For example, all MSB pages (e.g., including the neighboring MSB pages) can be programmed first, followed by programming all LSB pages. All LSB pages can be programmed when all (or most) MSB pages are programmed (or partially programmed).

Figure 2:
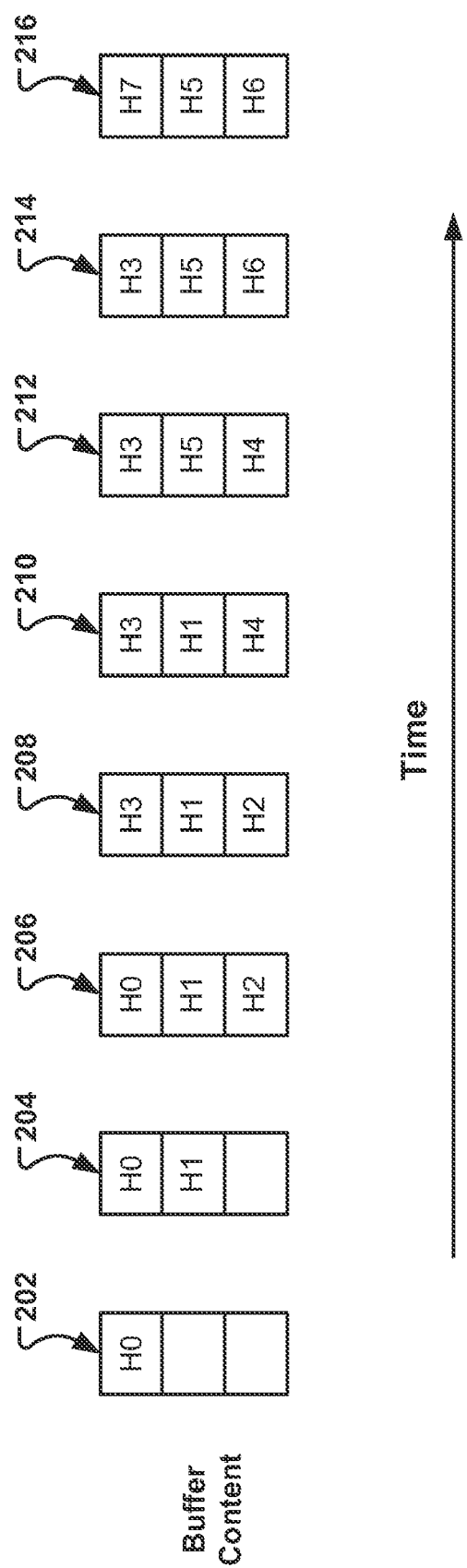
FIG. 2 shows an example of a programming sequence for programming a buffer memory.

FIG. 2 shows an example of a programming sequence for programming the buffer memory 166 in a manner discussed above. Referring to FIG. 2, the buffer memory can store multiples of pages at a time as buffer content. For the purpose of brevity and simplicity, FIG. 2 shows only three pages stored in the buffer memory. One skill in the art would readily recognize that a buffer memory can store a greater or lesser number than those shown, and the capacity of the buffer memory is dependent on the size of the buffer memory used.

As shown, the buffer memory 166 can initially store page "H0" as shown in the storage capacity 202. Then, page "H1" can be stored in the buffer memory 166 (as shown in the storage capacity 204), followed by page "H2" (as shown in the storage capacity 206).

As discussed above, all MSB pages (and neighboring MSB pages) can be programmed first. For example, the memory controller 130 can retrieve page "H0", which is the first MSB page to be programmed, from the buffer memory 166, and begin with the programming of page "H0" into the MSB page at the target word line, which is word line "0". Once the programming of page "H0" into the MSB page at word line "0" is completed, which yields additional storage capacity to the buffer memory 166 for buffering additional data, the memory controller 130 can latch the next page (e.g., page "H3") into the buffer memory 166 (as shown in the storage capacity 208). At this time, page "H2", which is the neighboring MSB page is extracted from the buffer memory 166. The extracted page is then programmed into word line "1", which neighbors word line "0".

Once page "H2" has been programmed into word line "1", which again yields additional storage capacity to the buffer memory 166 for buffering additional data, the memory controller 130 can latch the next page (e.g., page "H4") into the buffer memory 166 (as shown in the storage capacity 210).

With both MSB page "H0" at word line "0" and MSB page "H2" at word line "1" programmed, the memory controller 130 can retrieve the first LSB page (e.g., page "H1") from the buffer memory 166, and begin with the programming of page "H1" into the LSB page at word line "0". Concurrently or sequentially, the memory controller can also program the next MSB page (e.g., page "H4") into the MSB page at the next word line (e.g., word line "2") while latching the next page (e.g., page "H5") into the buffer memory 166 (as shown in the storage capacity 212).

Upon completing the programming of page "H1" at word line "0" and page "H4" at word line "2", the memory controller 130 can again proceed with the programming of the next LSB page (e.g., page "H3") at word line "1" while latching the next page (e.g., page "H6") into the buffer memory 166 (as shown in the storage capacity 214). Concurrently or sequentially, the memory controller can also program the next MSB page (e.g., page "H6") into the MSB page at the next word line (e.g., word line "3") while latching the next page (e.g., page "H7") into the buffer memory 166 (as shown in the storage capacity 216).

As shown in the programming sequence above, implementing a buffer memory allows data to be buffered and written in a predetermined sequence by programming the neighboring word lines first prior to completing the programming of the target word of a particular cell (e.g., programming "H2" at word line "1" prior to completing the programming of word line "0"). In doing so, programming operation of the neighboring word lines can be kept at a minimum, which reduces the impact of the distortion effects caused by the neighboring cells. Further, the aforementioned sequence allows each flash memory device 106a-106d to precompensate for the undesired distortion on its own, allowing any inter-cell interference to be minimized while relieving the solid state drive controller 104 and the memory controller 130 from complex configuration in executing precompensation programming.

While the example provided above for a two-bit flash memory shows that the word lines are programmed in a monotonically-increasing order starting from word line "0", the programming sequence also can be reversed so that word line "0" is the last word line to be programmed (e.g., in a monotonically-decreasing order). Also, depending on the application, LSB pages can be programmed first, followed by MSB pages.

Similarly, where a three-bit-per-cell flash memory is used, the lowest-significant binary bits (e.g., LSBs and CSBs) can be programmed only after programming of the higher-significant binary bits (e.g., MSBs and CSBs) is completed (e.g., for all cells) in the target word line. In programming the higher-significant bits in the target word line, the higher-significant bits of neighboring word lines also are considered.

Figure 4:
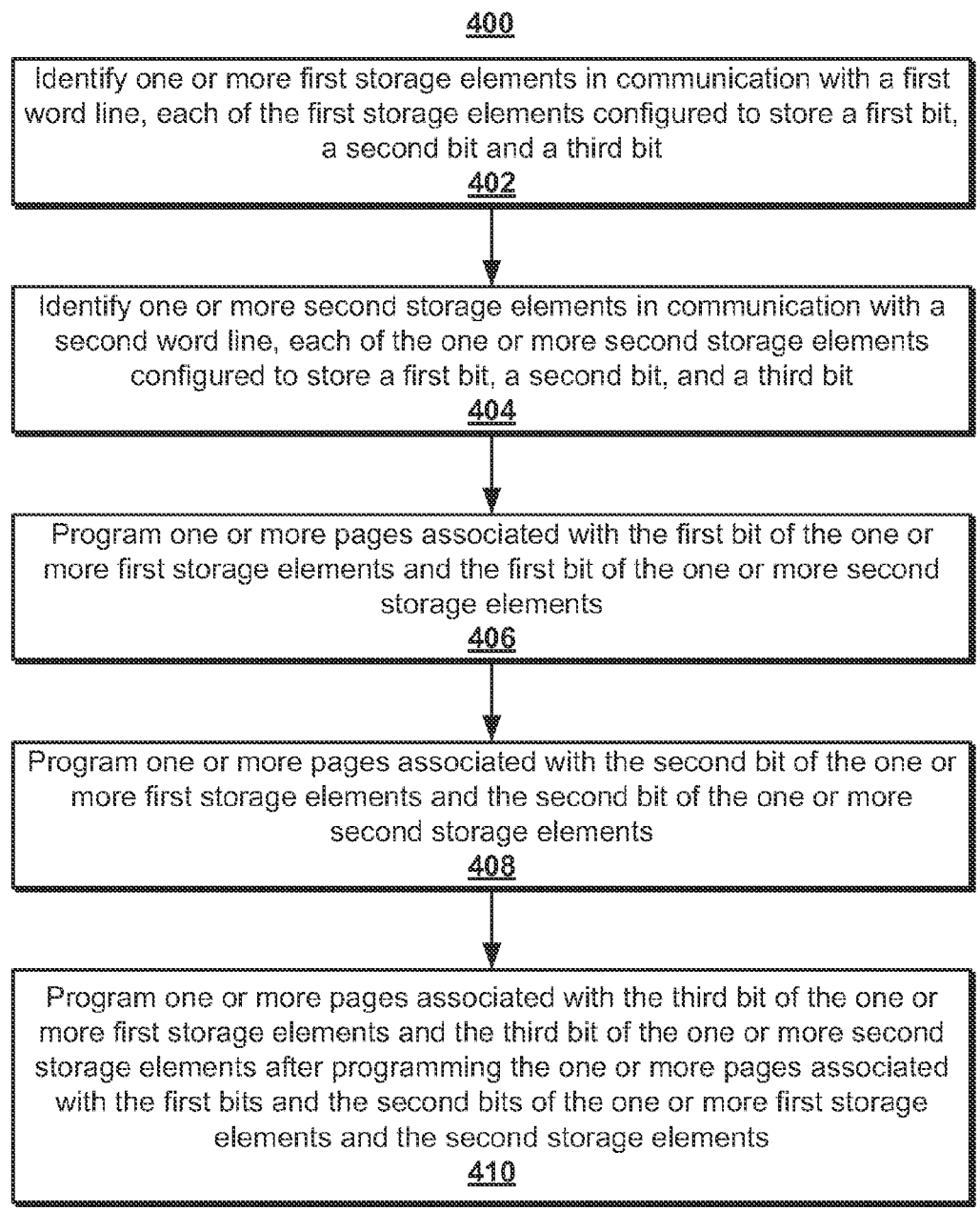
FIG. 4 shows an example of a process for programming a three-bit flash memory.

FIG. 4 shows an example of a process 400 for programming a three-bit flash memory. The process 400 can be performed, for example, by the solid state system 100 or the solid state drive controller 104, and for clarity of presentation, the description that follows uses the solid state drive controller 104 as the basis of examples for describing the process 400. However, another system or combination of devices and systems also can be used to perform the process 400.

Referring to FIG. 4, at 402, one or more first storage elements in communication with a first word line can be identified. In some implementations, each of the one or more first storage elements can be configured to store a first bit, a second bit, and a third bit. For example, for a three-bit cell memory, the cells can be eight-level cells ($2^3$=8), with each cell capable of storing three bits and whose programming levels can be mapped to provide the bit patterns of {111}, {011}, {001}, {101}, {100}, {000}, {010}, and {110}, in ascending order of storage values. In some implementations, the first bit to be written to the cells can be the binary LSB, the second bit to be written to the cells can be the binary CSB, and the third bit to be written to the cells can be the binary MSB.

At 404, one or more second storage elements in communication with a second word line can be identified. In some implementations, each of the one or more second storage elements can be configured to store the first bit, the second bit and the third bit.

At 406, one or more pages associated with the first bit of the one or more first storage elements and the first bit of the one or more second storage elements can be programmed. For example, the MSB of each cell can first be programmed (e.g., during a first phase of programming sequence) so that all MSB of pages can be completed prior to programming the CSB and LSB.

At 408, one or more pages associated with the second bit of the one or more first storage elements and the second bit of the one or more second storage elements can be programmed. For example, at a second phase of programming sequence, CSB programming can be executed to program all CSB pages, which include programming cells with logical "1" to logical "11" and "01", and logical "0" to logical "00" and "10".

At 410, one or more pages associated with the third bit of the one or more first storage elements and the third bit of the one or more second storage elements can be programmed after programming the one or more pages associated with the first bits and the second bits of the one or more first storage elements and the second storage elements. For example, at a third phase of programming sequence, LSB programming can be executed to program all LSB pages, which results in cells with logical "11" being programmed to logical "111" and logical "011"; logical "01" to logical "001" and logical "101"; logical "00" to logical "100" and logical "000"; and logical "10" to logical "010" and logical "110".

FIG. 5 shows an example of another process 500 for programming a three-bit flash memory. The process 500 can be performed, for example, by the solid state system 100 or the solid state drive controller 104, and for clarity of presentation, the description that follows uses the solid state drive controller 104 as the basis of examples for describing the process 500. However, another system or combination of devices and systems also can be used to perform the process 500.

As discussed above, the process 400 shown in FIG. 4 can be implemented to execute a programming process where pages for each bit are programmed before programming the next bit. Unlike process 400, process 500 can be implemented to execute a programming process where neighboring cells are considered in programming a target cell.

Referring to FIG. 5, at 502, a request to program N-bit data into a plurality of storage elements can be received. In some implementations, the N-bit data including first bit data and last bit data, where N>1.

At 504, a first storage element in the plurality of storage elements to be programmed first can be identified.

At 506, one or more neighboring storage elements adjacent to the first storage element can be identified. In some implementations, the one or more neighboring storage elements can be in communication with a word line different from that of the first storage element.

At 508, the first bit data into the first storage element can be programmed.

At 510, the last bit data into the first storage element can be programmed after programming corresponding first bit data into the neighboring storage elements.

The example solid state drive system 100 shown in FIG. 1A is an exemplary system configuration, which is shown purely for the sake of conceptual clarity. Any other suitable memory system configuration also can be used. Elements that are not necessary for understanding the principles of the subject matter described herein, such as various interfaces, addressing circuits, timing and sequencing circuits and debugging circuits, have been omitted from the figure for clarity.

The solid state drive system 100 or the solid state drive controller 104 including the solid state controller 108 and the memory controller 130 can be mounted in a package. Function blocks and peripheral circuits can be further included in the package. For example, the solid state drive system 100 or the solid state drive controller 104 can be mounted in a package such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Package, Die in Wafer Form, Chip On Board (COB), Ceramic Dual In-Line Package (CERDIP), Plastic Metric Quad Flat Package (MQFP), Thin Quad Flat Package (TQFP), Small Outline Integrated Circuit (SOIC), Shrink Small Outline Package (SSOP), Thin Small Outline Package (TSOP), Thin Quad Flat Package (TQFP), System In Package (SIP), Multi Chip Package (MCP), Wafer-level Fabricated Package (WFP), Wafer-Level Processed Stack Package (WSP), and the like.

The solid state drive system 100 or the solid state drive controller 104 including the solid state controller 108 and the memory controller 130 also can reside in a memory card. The memory card can communicate with an external device (e.g., a host) through at least one interface among Universal Serial Bus (USB), Multimedia Card (MMC), Peripheral Component Interconnect-Express (PCI-E), Serial Advanced Technology Attachment (SATA), Parallel Advanced Technology Attachment (PATA), Small Computer System Interface (SCSI), Enhanced Small Device Interface (ESDI), Integrated Drive Electronics (IDE), and the like.

The solid state drive system 100 or the solid state drive controller 104 including the solid state controller 108 and the memory controller 130 also can reside in a mobile device such as a cellular phone, a personal digital/data assistant (PDA), a digital camera, a portable game console and MP3 player. Where the solid state drive system 100 or the solid state drive controller 104 is implemented in a mobile device, the flash memory devices 106a-106d can be internal or external to the mobile device, and can store codes for an operation of the mobile device as well as data.

The solid state drive system 100 or the solid state drive controller 104 including the solid state controller 108 and the memory controller 130 can be adaptable to a home application such as a high definition television (HDTV), a digital video disk, a digital versatile disc (DVD), a router, Global Positioning System (GPS), and the like.

The solid state drive system 100 or the solid state drive controller 104 including the solid state controller 108 and the memory controller 130 can be adaptable to a computing system. Where the solid state drive system 100 or the solid state drive controller 104 is implemented in a computing system, the solid state drive system 100 or the solid state drive controller 104 can further include a microprocessor electrically coupled to a bus, a user interface, and a modem such as a baseband chipset. The flash memory devices 106a-106d can be provided as internal or external components to the computing system, and can store data that can be processed by the microprocessor through the memory controller 130. In a case where the computing system is a mobile device, a battery for supply of an operating voltage of the computing system can be further included. It will be understood to those skilled in the art that the computing system can further include an application chipset, a camera image processor (CIS), and/or a mobile DRAM.

The flash memory devices 106a-106d are non-volatile memory devices capable of maintaining stored data even though power is off. Thus, it will be understood to those skilled in the art that the flash memory devices 106a-106d can be adaptable to various devices, apparatuses, and systems as well as applications.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "system" encompasses all apparatus, devices, and machines for processing data, including by way of example a programmable processor, a computer, or multiple processors or computers. The system can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Other implementations fall within the scope of the following claims.

What is claimed is:

1. A method comprising:
    identifying one or more first storage elements in communication with a first word line, each of the one or more first storage elements configured to store a first bit, a second bit, and a third bit;
    identifying one or more second storage elements in communication with a second word line, each of the one or more second storage elements configured to store a first bit, a second bit and a third bit;
    programming one or more pages associated with the first bit of the one or more first storage elements and the first bit of the one or more second storage elements;
    programming one or more pages associated with the second bit of the one or more first storage elements and the second bit of the one or more second storage elements; and
    programming one or more pages associated with the third bit of the one or more first storage elements and the third bit of the one or more second storage elements after programming the one or more pages associated with the first bits and the second bits of the one or more first storage elements and the second storage elements.

2. The method of claim 1, wherein programming the one or more pages associated with the second bit of the one or more first storage elements and the second bit of the one or more second storage elements includes:
    programming the one or more pages associated with the second bit of the one or more first storage elements and the second bit of the one or more second storage elements after programming the one or more pages associated with the first bit of the one or more first storage elements and the first bit of the one or more second storage elements.

3. The method of claim 1, wherein identifying one or more second storage elements in communication with the second word line includes identifying one or more second storage elements in communication with a word line that is adjacent to the first word line, the word line being the second word line.

4. The method of claim 1, wherein identifying one or more first storage elements includes identifying one or more first storage elements configured to store a most significant bit, a central significant bit, and a lease significant bit.

5. The method of claim 4, wherein identifying one or more second storage elements includes identifying one or more second storage elements configured to store the most significant bit, the central significant bit, and the least significant bit.

6. A method comprising:
    receiving a request to program N-bit data into a plurality of storage elements, the N-bit data including first bit data and last bit data, where N>1;
    identifying a first storage element in the plurality of storage elements to be programmed first;
    identifying one or more neighboring storage elements adjacent to the first storage element, the one or more neighboring storage elements in communication with a word line different from that of the first storage element;
    programming the first bit data into the first storage element; and
    programming the last bit data into the first storage element after programming first bit data into the one or more neighboring storage elements.

7. The method of claim 6, wherein receiving the request to program N-bit data includes receiving a request to program three-bit data including the first bit data, second bit data and the last bit data into the plurality of storage elements, each storage element configured to store data including a most-significant-bit (MSB) page corresponding to the first bit data, a central-significant-bit (CSB) page corresponding to the second bit data, and a least-significant-bit (LSB) page corresponding to the last bit data.

8. The method of claim 7, wherein programming the first bit data into the first storage element includes programming the MSB page into the first storage element.

9. The method of claim 8, wherein programming the first bit data into the one or more neighboring storage elements includes programming corresponding MSB pages of the first bit data into the one or more neighboring storage elements.

10. The method of claim 8, wherein programming the last bit data into the first storage element includes programming the LSB page into the first storage element.

11. The method of claim 10, wherein programming the LSB page into the first storage element is performed after programming the MSB page into the first storage element and corresponding MSB pages of the first bit data into the one or more neighboring storage elements.

12. The method of claim 8, further comprising programming the CSB page into the first storage element after programming the MSB page into the first storage element and corresponding MSB pages of the first bit data into the one or more neighboring storage elements.

13. The method of claim 12, further comprising:
    programming corresponding CSB pages of the second bit data into the one or more neighboring storage elements after programming the CSB page into the first storage element.

14. The method of claim 13, wherein programming the last bit data into the first storage element includes programming the last bit data including the LSB page into the first storage element after programming the second bit data including the CSB page into the first storage element and the second bit data including corresponding CSB pages into the one or more neighboring storage elements.

15. A system comprising:
    a memory cell array including a plurality of storage elements including a first storage element and one or more neighboring storage elements, the first storage element and the one or more neighboring storage elements in communication with a different word line; and a memory controller configured to:
program first bit data into the first storage element;
program corresponding first bit data into a neighboring storage element after the first bit data has been programmed into the first storage element; and
program last bit data into the first storage element after the corresponding first bit data has been programmed into the neighboring storage element.

16. The system of claim 15, wherein each storage element is configured to store data including a most-significant-bit (MSB) page corresponding to the first bit data and a least-significant-bit (LSB) page corresponding to the last bit data.

17. The system of claim 16, wherein the first bit data programmed into the first storage element includes the MSB page.

18. The system of claim 17, wherein the corresponding first bit data programmed into the one or more neighboring storage elements includes corresponding MSB pages.

19. The system of claim 17, wherein the last bit data programmed into the first storage element includes the LSB page.

20. The system of claim 19, wherein the memory controller is configured to program the LSB page into the first storage element after programming the MSB page into the first storage element and the corresponding MSB pages into the one or more neighboring storage elements.

21. The system of claim 17, wherein the memory controller is further configured to program additional bit data including a central-significant-bit (CSB) page into the first storage element after programming the MSB page into the first storage element and the corresponding MSB pages into the one or more neighboring storage elements.

22. The system of claim 21, wherein the memory controller is further configured to program corresponding CSB pages into the one or more neighboring storage elements after programming the CSB page into the first storage element.

23. The system of claim 22, wherein the memory controller is further configured to program the LSB page into the first storage element after programming the CSB page into the first storage element and the corresponding CSB pages into the one or more neighboring storage elements.

24. The device of claim 23, wherein a request is received to program N-bit data into the plurality of storage elements, the N-bit data including first bit data, the corresponding first bit data, and the second bit data, where N>1.

25. A device comprising:
a memory cell array including a plurality of storage elements including a first storage element and one or more neighboring storage elements, the first storage element and the one or more neighboring storage elements in communication with a different word line; and
a buffer memory including one or more buffers, the buffer memory configured to:
receive first bit data to be programmed into the first storage element, the first bit data stored in a first buffer;
receive second bit data to be programmed into the first storage element, the second bit data stored in a second buffer
receive corresponding first bit data to be programmed into a neighboring storage element, the corresponding first bit data stored in a third buffer; and
release one of the first buffer, second buffer or third buffer for storing newly received bit data after any one of the first bit data, the corresponding first bit data and the second bit data has been programmed.

26. The device of claim 25, wherein the buffer memory is configured to receive corresponding second bit data to be programmed into a neighboring storage element, the corresponding second bit data stored in the first buffer after completing programming the first bit data stored in the first buffer.

27. The device of claim 25, wherein a size of the buffer memory is at least twice a programming unit size of the memory cell array.

* * * * *